(12) United States Patent
Loh et al.

(10) Patent No.: US 8,421,165 B2
(45) Date of Patent: Apr. 16, 2013

(54) APPARATUS, SYSTEM, AND METHOD FOR TUNNELING MOSFETS USING SELF-ALIGNED HETEROSTRUCTURE SOURCE AND ISOLATED DRAIN

(75) Inventors: Wei-Yip Loh, Austin, TX (US);
Kanghoon Jeon, Albany, CA (US);
Chanro Park, Austin, TX (US)

(73) Assignee: Sematech, Inc., Austin, TX (US)

( * ) Notice: Subject to any disclaimer, the term of this patent is extended or adjusted under 35 U.S.C. 154(b) by 326 days.

(21) Appl. No.: 12/777,877

(22) Filed: May 11, 2010

(65) Prior Publication Data
US 2011/0278670 A1 Nov. 17, 2011

(51) Int. Cl.
*H01L 21/02* (2006.01)
*H01L 21/336* (2006.01)

(52) U.S. Cl.
USPC ............................ 257/410; 257/288; 438/286

(58) Field of Classification Search ........................ None
See application file for complete search history.

(56) References Cited

U.S. PATENT DOCUMENTS

| | | | |
|---|---|---|---|
| 4,835,581 A | 5/1989 | Kuroda et al. | 257/105 |
| 5,365,083 A | 11/1994 | Tada | 257/105 |
| 5,489,792 A | 2/1996 | Hu et al. | 257/347 |
| 2007/0178650 A1 | 8/2007 | Chen et al. | 438/301 |
| 2008/0050881 A1 | 2/2008 | Chen et al. | 438/301 |
| 2010/0230790 A1* | 9/2010 | Disney | 257/666 |
| 2011/0147838 A1* | 6/2011 | Gossner et al. | 257/345 |

* cited by examiner

*Primary Examiner* — Daniel Whalen
(74) *Attorney, Agent, or Firm* — Fulbright & Jaworski L.L.P.

(57) ABSTRACT

Apparatuses, systems, and methods for tunneling MOSFETs (TFETs) using a self-aligned heterostructure source and isolated drain. TFETs that have an abrupt junction between source and drain regions have an increased probability of carrier direct tunneling (e.g., electrons and holes). The increased probability allows a higher achievable on current in TFETs having the abrupt junction.

18 Claims, 7 Drawing Sheets

APPARATUS, SYSTEM, AND METHOD FOR TUNNELING MOSFETS USING SELF-ALIGNED HETEROSTRUCTURE SOURCE AND ISOLATED DRAIN

BACKGROUND OF THE INVENTION

1. Field of the Invention

The present disclosure generally relates to semiconductor devices. More specifically, the present disclosure relates to tunneling field-effect transistors.

2. Description of the Related Art

Advances in the semiconductor industry have reduced the size of transistors in integrated circuits (ICs) to 45 nm. Continuing pressure to create smaller and more power efficient products will continue to reduce the transistor size to 32 nm and smaller. Decreases in transistor size lead to decreases in power supply voltage to the transistors and capacitance of the transistors. As the power supply voltage has decreased, the threshold voltage of the transistors in the ICs has also decreased.

Lower threshold voltages are difficult to obtain in conventional metal-oxide-semiconductor field-effect transistors (MOSFETs) because as the threshold voltage is reduced the ratio of on current to off current (Ion/Ioff) also decreases. The on current refers to the current through a MOSFET when a gate voltage applied is above the threshold voltage, and the off current refers to current through a MOSFET when a gate voltage applied is below the threshold voltage.

Tunneling field-effect transistors (TFETs) have improved Ion/Ioff ratios. Band-to-band tunneling in TFETs increases the achievable Ion allowing further reductions in threshold voltage, power supply voltage, and transistor size. A conventional TFET includes a drain region and a source region in a substrate layer and the drain region and the source region are doped with opposite carriers. For example, the drain region may be an n-doped region and the source region may be a p-doped region. A gate oxide is deposited on the substrate layer, and a gate electrode is deposited on the gate oxide. A gate voltage above the threshold voltage applied to the gate electrode switches the TFET from an off state to an on state.

SUMMARY OF THE INVENTION

A Tunneling Field Effect Transistor (TFET) is presented. In one embodiment, the apparatus includes an insulating layer, a first semiconductor layer on the insulating layer, a first doped region on the first semiconductor layer, and a second doped region on the first semiconductor layer. In some embodiments, the second doped region is separated from the first doped region. Additionally, some embodiments may include a second semiconductor layer on the first doped region, where the second semiconductor layer is coupled to the second doped region. Also, some embodiments may include a gate stack on the second semiconductor layer, where the gate stack is in complete contact with the second semiconductor layer.

In some embodiments, the gate stack may comprise a first dielectric layer and a first metal contact. The dielectric layer may be a high-k material. The first metal contact may be Tantalum Nitride (TaN). The first metal contact may also be a electrically conductive material such as polycrystalline silicon. In some embodiments, an insulating layer separates the first doped region and the second doped region. The insulating layer may include a semiconductor, a dielectric layer, an air gap, or a combination thereof.

In some embodiments, the first doped region comprises germanium (Ge). In some embodiments the first doped region is doped with a p-type dopant. The p-type dopant may be boron, aluminum and/or gallium. In some embodiments, the dopants can be incorporated in-situ during epitaxial growth. In some embodiments dopants can be incorporated via an implantation scheme including conventional ion-implant, plasma or through solid state diffusion (e.g. molecular layer diffusion).

In some embodiments, the second doped region comprises silicon (Si). In some embodiments, the second doped region is doped with an n-type dopant. The n-type dopant may be nitrogen, phosphorous, and/or arsenic.

In some embodiments, the TFET may further comprise a third doped region coupled to the first doped region. The third doped region may be Si. In some embodiments, the third doped region may be doped using a p-type dopant. The p-type dopant may be boron, aluminum and/or gallium.

Also presented is an Integrated Circuit (IC) device. The IC device may include a chip package configured to house an IC, at least one TFET disposed within the chip package, and a plurality of electrical interface pins coupled to the chip package and in communication with the IC. The electrical interface pins may be configured to conduct electrical signals. In some embodiments, the TFET includes an insulating layer, a first semiconductor layer on the insulating layer, a first doped region on the first semiconductor layer, and a second doped region on the first semiconductor layer. In some embodiments, the second doped region may be separated from the first doped region. In some embodiments, the TFET includes a second semiconductor layer on the first doped region, where the second semiconductor layer is coupled to the second doped region. Additionally, the TFET may include a gate stack on the second semiconductor layer, where the gate stack is in complete contact with the second semiconductor layer.

In some embodiments, the first doped region is Ge. The first doped region may be doped with a p-type dopant. The p-type dopant may be boron, aluminum and/or gallium. In some embodiments, the second doped region may be Si. The second doped region may be doped with an n-type dopant. The n-type dopant of the second doped region may be nitrogen, phosphorous, and/or arsenic.

Method for manufacturing a semiconductor device is also presented. The methods in the disclosed embodiments substantially include the steps necessary to carry out the functions presented above with respect to the operation of the described apparatus and system. In some embodiments, the method includes forming a first semiconductor layer on an insulator, forming a first doped region on the first semiconductor layer, forming a second semiconductor region on the first doped region, and forming a gate stack on the second semiconductor layer, where the gate stack is in complete contact with the second semiconductor layer. Additionally, the method may include etching the second semiconductor layer and the first doped region adjacent to the gate stack, etching the first doped region under the gate stack, and forming a second doped region on the first semiconductor layer.

In some embodiments, forming the first doped region on the first semiconductor layer further comprises depositing germanium on the first semiconductor layer and doping the germanium with a p-type dopant. The first doped region may be epitaxially deposited onto the first semiconductor layer. The first doped region may be doped with boron, aluminum and/or gallium.

In some embodiments, forming the second semiconductor layer comprises depositing silicon onto the first doped region. The second semiconductor layer may be deposited epitaxially using ultra-high vacuum chemical vapor deposition (UH-CVD) or molecular beam epitaxy (MBE). In some applications where leakage is not a significant concern, the second semiconductor layer may also be deposited in poly-crystalline form using low pressure chemical vapor deposition (LPCVD) or physical vapor deposition (PVD).

In some embodiments, etching the second semiconductor layer and the first doped region adjacent to the gate stack includes applying a mask layer over the first doped region, and performing an anisotropic etch to remove a portion of the second semiconductor layer and a portion of the first doped region. The mask layer may be a dielectric hardmask, or it may be a photoresist layer. In some embodiments, the second semiconductor layer and the first doped region may be etched right next to the gate stack. In some embodiments, a portion of the gate stack may be etched along with the second semiconductor region and the first doped region.

In some embodiments, etching the first doped region under the gate stack comprises performing an isotropic etch. Etching the first doped region may result in a gap next to the first doped region and under the second semiconductor region.

In some embodiments, forming a second doped region on the first semiconductor layer comprises depositing a semiconductor material. In some embodiments, the semiconductor material may be silicon. In some embodiments, the second doped region may be doped with an n-type dopant. The n-type dopant may be nitrogen, phosphorous, and/or arsenic.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION

Various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Figure 1:
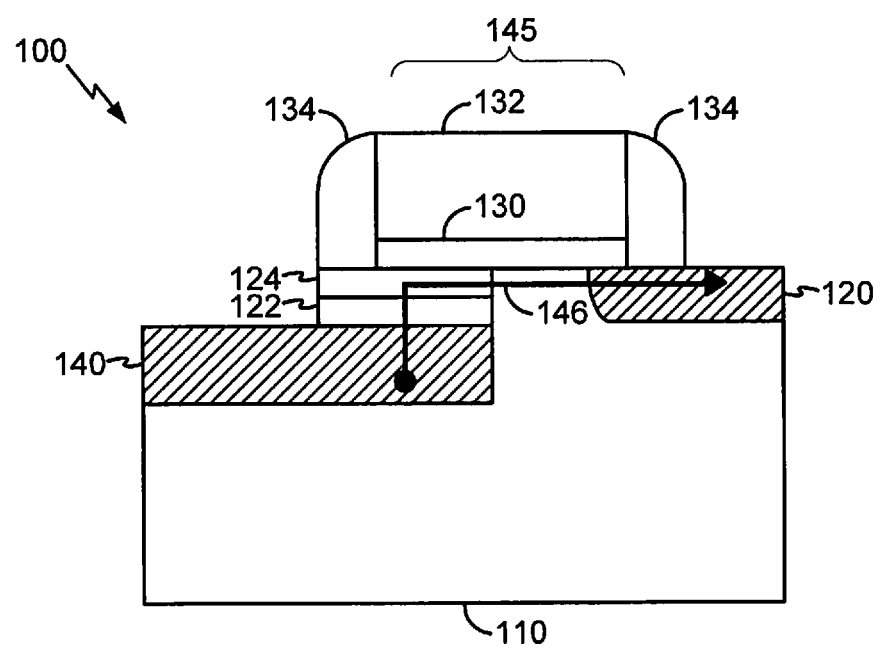
FIG. 1 is a schematic block diagram illustrating one embodiment of a TFET according to U.S. patent application Ser. No. 12/719,697, which is hereby incorporated by reference in its entirety.

FIG. 1 illustrates a cross-sectional view of one embodiment of a Tunneling Field Effect Transistor (TFET), TFET 100, as disclosed in U.S. patent application Ser. No. 12/719, 697. A semiconductor layer 110 includes a drain region 120 and a source region 140. The semiconductor layer 110 may be, for example, silicon, germanium, or III-V compound semiconductors. The regions 120, 140 are asymmetric, that is, the regions 120, 140 are doped with opposite carriers. For example, the drain region 120 may be n-doped with arsenic, and the source region 140 may be p-doped with boron. During an on state, current conducts substantially along a path illustrated by a line 146. According to one embodiment, the regions 120, 140 may be heavily doped with a concentration of between $1\times10^{19}$ and $1\times10^{21}$ atoms/cm$^3$. A gate stack 145 including a gate oxide 130 and a gate electrode 132 are on the semiconductor layer 110 and partially covering the regions 120, 140. The gate oxide 130 may be, for example, high-K dielectrics, silicon oxide, hafnium silicon oxynitride (HfSiON), or other oxides, and the gate electrode 132 may be, for example, a metal or poly-silicon. Spacers 134 are deposited on the sides of the gate stack 145. The spacers 134 may be, for example, silicon oxide, silicon nitride, high-K dielectrics, or other insulating materials.

A dielectric layer 122 is on the source region 140 and may be, for example, silicon oxide, silicon nitride, zirconium oxide, lanthanum oxide, aluminum oxide, or another dielectric material. According to one embodiment, the dielectric layer 122 is a dielectric with low permittivity and has a thickness between 5 and 50 Angstroms. A low permittivity compared with the permittivity of silicon (approx. 11.9) creates a large field drop across the dielectric layer 122 and enhances band alignment. A semiconductor layer 124 is on the dielectric layer 122 and doped with an opposite carrier of the source region 140. The semiconductor layer 124 may be, for example, a poly-silicon layer or epitaxially grown silicon with thickness between 5 and 30 Angstroms. According to one embodiment, the drain region 120 may be n-doped and the semiconductor layer 124 may be p-doped. The dielectric layer 122 and the semiconductor layer 124 create an abrupt junction in the doping profile of the TFET 100. The geometry of the abrupt junction enhances the electric field, allows direct tunneling, and creates a higher tunneling probability for carriers (e.g., holes and electrons). According to some embodiments, the semiconductor layer 124 may be absent, such that the dielectric layer 122 creates an abrupt junction without the semiconductor layer 124.

Figure 2:
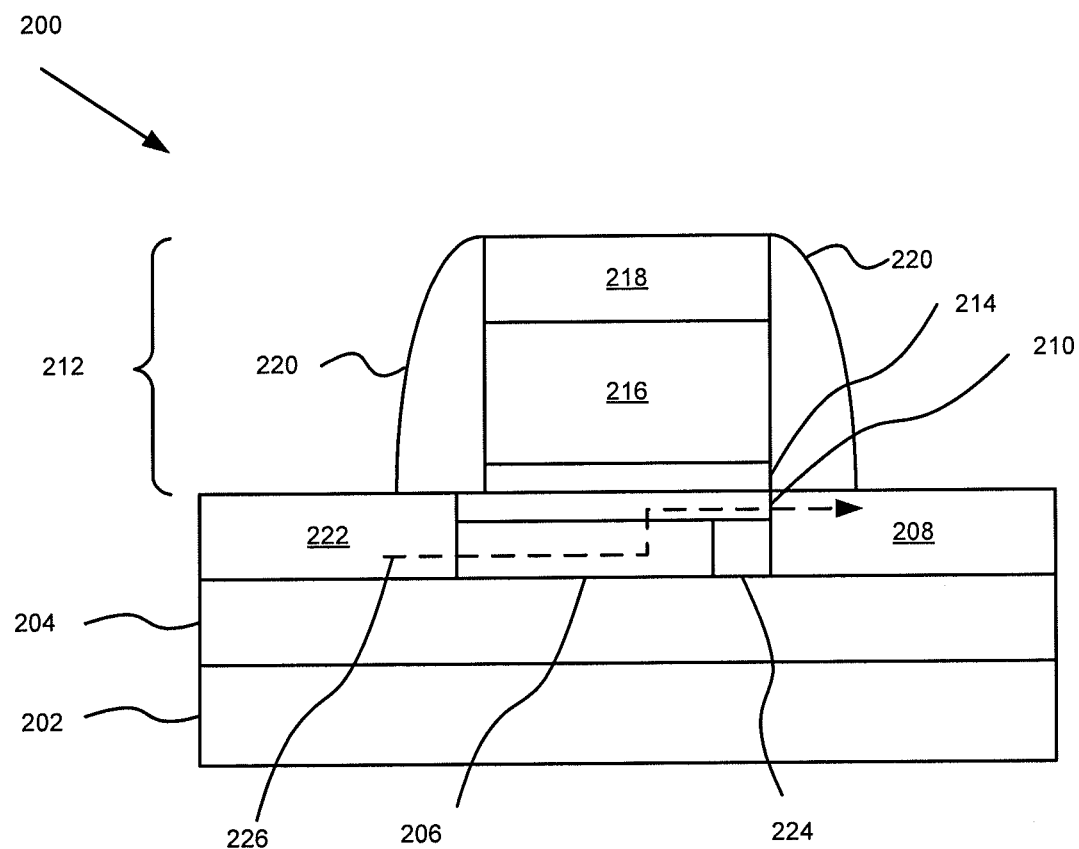
FIG. 2 is a is a cross-sectional view illustrating an exemplary TFET according to one embodiment.

FIG. 2 shows a cross-sectional view of one embodiment of a TFET as presently disclosed. A first semiconductor layer 204 is coupled to an insulator layer 202. Coupled to the first semiconductor layer 204 is a first doped region 206 and a second doped region 208. In this embodiment, the first doped region 206 is coupled to a third doped region 222, which functions as the source, and the second doped region 208 functions as the drain. The semiconductor layer 204 may be, for example, silicon, germanium, or III-V compound semiconductors. The insulator layer 202 may be a buried oxide layer.

One aspect of this embodiment is that the first doped region 206 and the second doped region 208 are asymmetric. That is, the regions 206 and 208 are doped with opposite carriers. For example, the second doped region 208 may be n-doped with arsenic, and the first doped region 206 may be p-doped with boron. According to one embodiment, the regions 206 and 208 may be heavily doped with a concentration of between $1 \times 10^{19}$ and $1 \times 10^{21}$ atoms/cm$^3$.

A gate stack 212 including a gate oxide 214, a gate metal electrode 216, and a gate semiconductor electrode 218 are on the second semiconductor layer 210. The gate oxide 214 may be, for example, high-K dielectrics, silicon oxide, hafnium silicon oxynitride (HfSiON), or other oxides. The gate metal electrode 216 may be any metal nitride (including tantalum nitride and titanium nitride), metal carbide (such as TaC), or metal alloys. The gate semiconductor electrode 216 may be, for example, a metal or poly-silicon. Spacers 220 are deposited on the sides of the gate stack 212. The spacers 220 may be, for example, silicon oxide, silicon nitride, high-K dielectrics, or other insulating materials.

A second semiconductor layer 210 is on the first doped region 206 and is coupled to the second doped region 208. The second semiconductor layer 210 may be, for example, a poly-silicon layer or epitaxially grown silicon with thickness between about 5 and 30 Angstroms. According to one embodiment, the second doped region 208 may be n-doped and the first doped region 206 may be p-doped. The second semiconductor layer 210 creates an abrupt junction in the doping profile of the TFET 200. The abrupt junction enhances the electric field, allows direct tunneling, and creates a higher tunneling probability for carriers (e.g., holes and electrons).

One aspect of this embodiment is that the gate oxide 214 is in complete contact with the second semiconductor layer 210. As used herein, the term complete contact means that substantially the entire bottom surface of the gate oxide 214 is in direct contact with the top surface of the second semiconductor layer 210. A large contact area between the gate oxide and the tunneling front of the second semiconductor layer 210 may maximize band-to-band tunneling and increase transistor efficiency.

Between the first doped region 206 and the second doped region 208 there is a separation 224. The separation 224 may be an air gap or it may be filled with a dielectric or undoped semiconductor. The separation 224 may decrease the leakage of current when the transistor is in the off state by decreasing the parasitic conduction path between the first doped region 206 and the second doped region 208.

TFET 200 may also include a third doped region 222 that is coupled to the first doped region 206. The third doped region 222 is typically where the source connection is made on the TFET. The third doped region 222 may be configured to maximize electrical conduction between the second doped region 206 and the third doped region 222. The third doped region 222 may be silicon, germanium, or III-V compound semiconductors and may be p-doped with boron. Spacers 220 are coupled to the gate stack 212. Spacers 220 are typically made of insulating dielectrics and are used to prevent electrical shorts between the third doped region 222 and the gate stack 212.

During typical operation, a voltage on the gate semiconductor electrode 216 will place the TFET 200 into an on state. During an on state, current conducts substantially along the path 226. The current travels from the third doped region 222, through the first doped region 206, through the second semiconductor layer 210, and through the region 208.

Figure 3A:
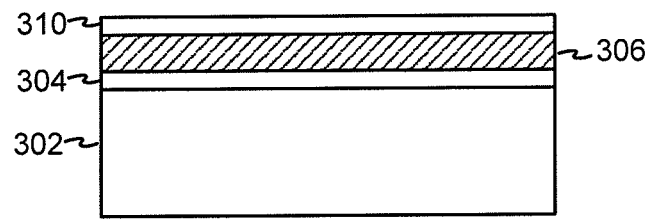
FIGS. 3A-3F are cross-sectional views illustrating a method for manufacturing an exemplary TFET according to one embodiment.
Figure 3B:
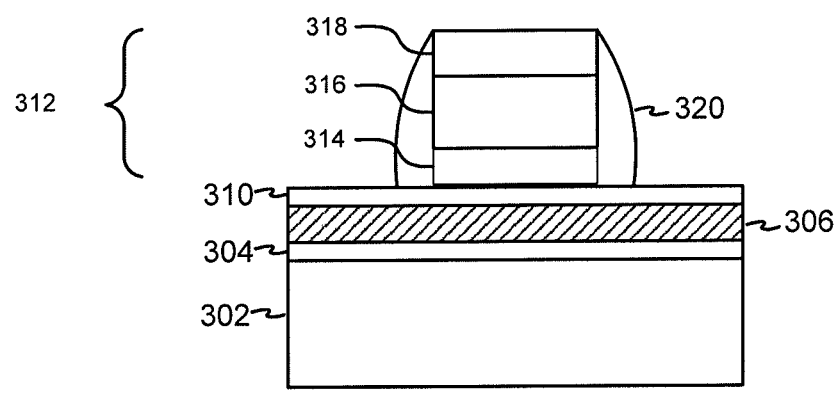
Figure 3C:
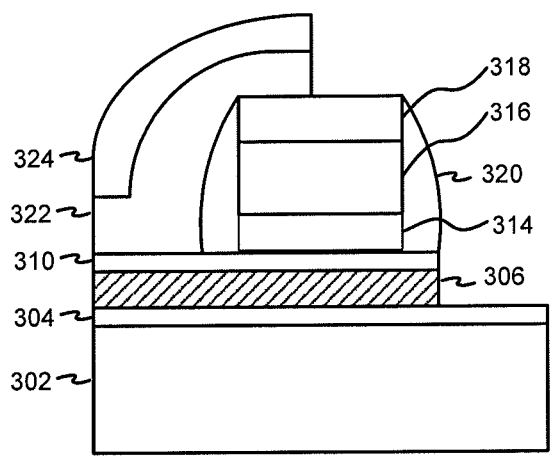
Figure 3D:
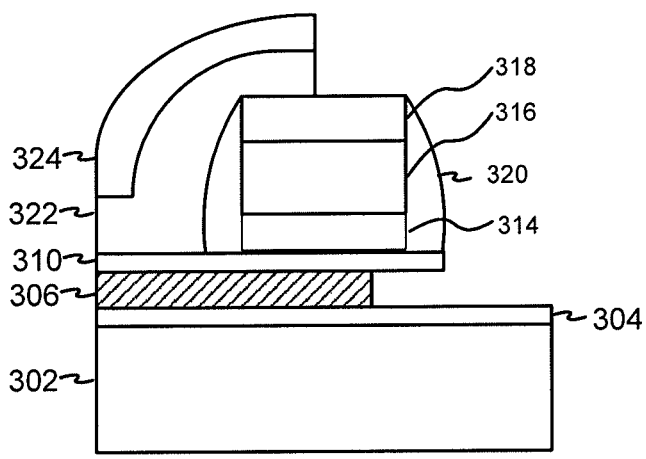
Figure 3E:
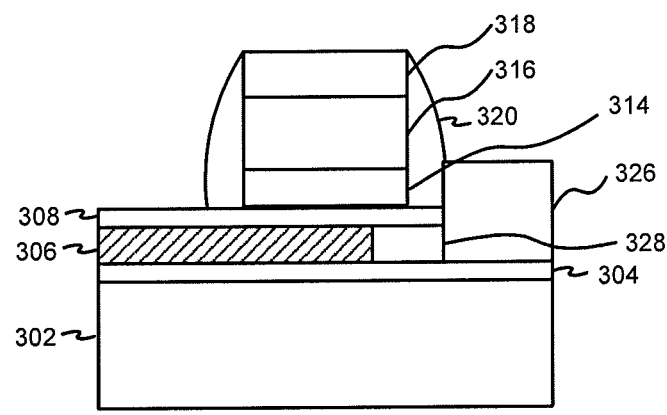
Figure 3F:
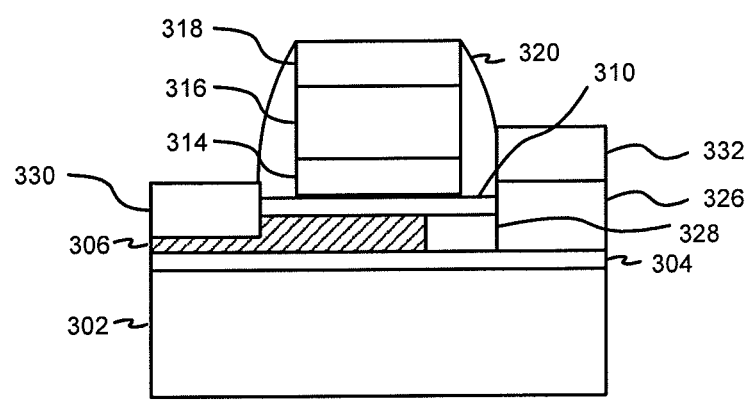
Figure 4:
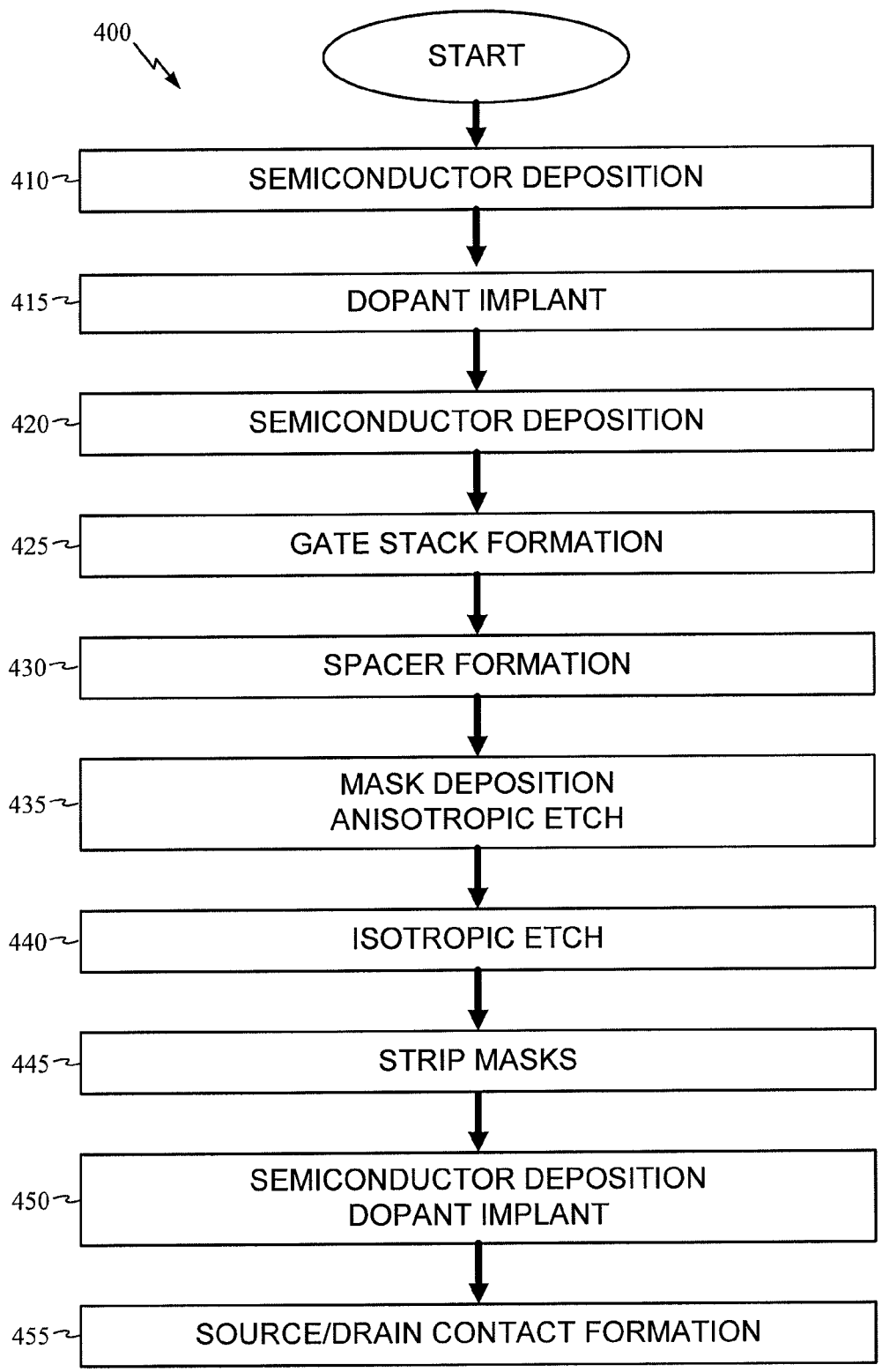
FIG. 4 is a flow chart illustrating an exemplary manufacturing method for a TFET according to one embodiment.

One method for manufacturing an exemplary TFET according to one embodiment is illustrated in the cross-sectional views of FIGS. 3A-3F and the flow chart of FIG. 4. A flow chart 400 starts at block 410 with semiconductor deposition. Turning to FIG. 3A, a cross-sectional view illustrating a partially complete TFET according to one embodiment is shown. A first semiconductor layer 304 is deposited on an insulator layer 302. The first semiconductor layer 304 may be, for example, silicon. In some embodiments, a starting material such as Si on BOX can be purchased commercially. Insulator layer 302 may be buried oxide or any semi-insulating large band-gap semiconductor. Next, another semiconductor, that will eventually become the first doped region 306, may be deposited onto the first semiconductor layer 302. Block 415 of flowchart 400 shows the step of dopant implantation 415, which may be used to create first doped region 206. A dopant may be implanted into the semiconductor above semiconductor layer 304, creating the first doped region 306. First doped region 306 may be silicon, germanium, or III-V compound semiconductors and may be p-doped with boron.

Block 420 of flow chart 400 shows another step of semiconductor deposition. In this step 420, a second semiconductor layer 310 may be deposited onto the first doped region 306. The second semiconductor layer 310 may be silicon, germanium, or III-V compound semiconductors.

The flow chart 400 continues to block 425 with gate stack formation. Turning now to FIG. 3B, a cross-sectional view illustrating a partially complete TFET after gate stack formation is shown. A gate oxide 314 may be deposited onto the second semiconductor layer 310, followed by a gate electrode 316, and a gate electrode 318. The gate oxide 312 may be, for example, high-K dielectrics, silicon oxide, or other oxides. The gate electrode 316 and the gate electrode 318 may be, for example, tantalum nitride and poly-silicon, respectively. The gate oxide 314, the gate electrode 316, and the gate electrode 318 are patterned into a gate stack 312. The flow chart 400 continues to block 430 with spacer formation. Spacers 320 are deposited and etched back to substantially cover sides of the gate stack 312.

Flow chart 400 continues to block 435 with mask deposition and an anisotropic etch. Turning to FIG. 3C a first mask layer 322, and a second mask layer may be deposited on to the structure. The first mask layer, for example, may be a dielectric. The second mask layer 324 may be a photoresist layer. The masks 322, 324 may also comprise a hardmask such as silicon nitride. After the masks 322, 324 have been deposited, an anisotropic etch may be performed adjacent to the gate stack. As shown in FIG. 3C, a portion of the second insulating layer 310 and a portion of the first doped region 306 may be etched away adjacent to the gate stack. It is this etch that may form the TFET with a self-aligned heterostructure. One method of performing the anisotrooopic etch is a reactive ion etch.

Flow chart 400 continues to block 440, which describes an isotropic etch and mask stripping. Turning to FIG. 3D, the isotropic etch of block 440 removes an additional portion of second doped region 306 from under the gate stack formation. The isotropic etch may be accomplished, for example, using a reactive ion etch or a wet etching. Next, in block 445, the masks 322 and 324 may be stripped from the structure using conventional plasma ashing and isotropic wet etching of mask 322.

Flow chart 400 continues to block 450 where a semiconductor is deposited onto the structure and doped, forming the second doped region 326, as shown in FIG. 3E. The second doped region 325 may be silicon, germanium, or III-V compound semiconductors and may be n-doped with arsenic. The second doped region 325 may also undergo an activation anneal. One aspect of this embodiment is the separation 328 between the first doped region 306 and second doped region 326. The separation 328 may be an air gap, filled with a dielectric or undoped semiconductor, or a combination thereof. The separation 328 may reduce the parasitic conduction path, and consequently the leakage current, between the first doped region 306 and the second doped region 326.

Flow chart 400 continues to block 455, where contacts may be formed over the first doped region 306 and the second doped region 326. In this embodiment, nickel (Ni) may be deposited onto the first doped region 306 to form the source contact 330. Ni may also be deposited onto the second doped region 326 to form the drain contact 332. Ni may be deposited using self-aligned salicidation, where Ni only forms over exposed Si. In typical operation, the TFET will be in an on state when voltage is applied to the gate electrode 318. Current will then typically flow from the source contact 330, through the first doped region 306, tunnel through the second semiconductor layer 310, through the second doped region 326 and finally to the drain contact 332.

One beneficial aspect of the current disclosure over the prior art is that it allows for the proper incorporation of a self-aligned heterostructure source with a conventional CMOS process flow without incurring high leakage current and reducing parasitic conduction paths. This process can be carried out without using advanced processes such as laser or flash annealing. Also, the process allows for low-temperature processing with a pre-formed source and a dopant-segregated silicided drain.

Figure 5:
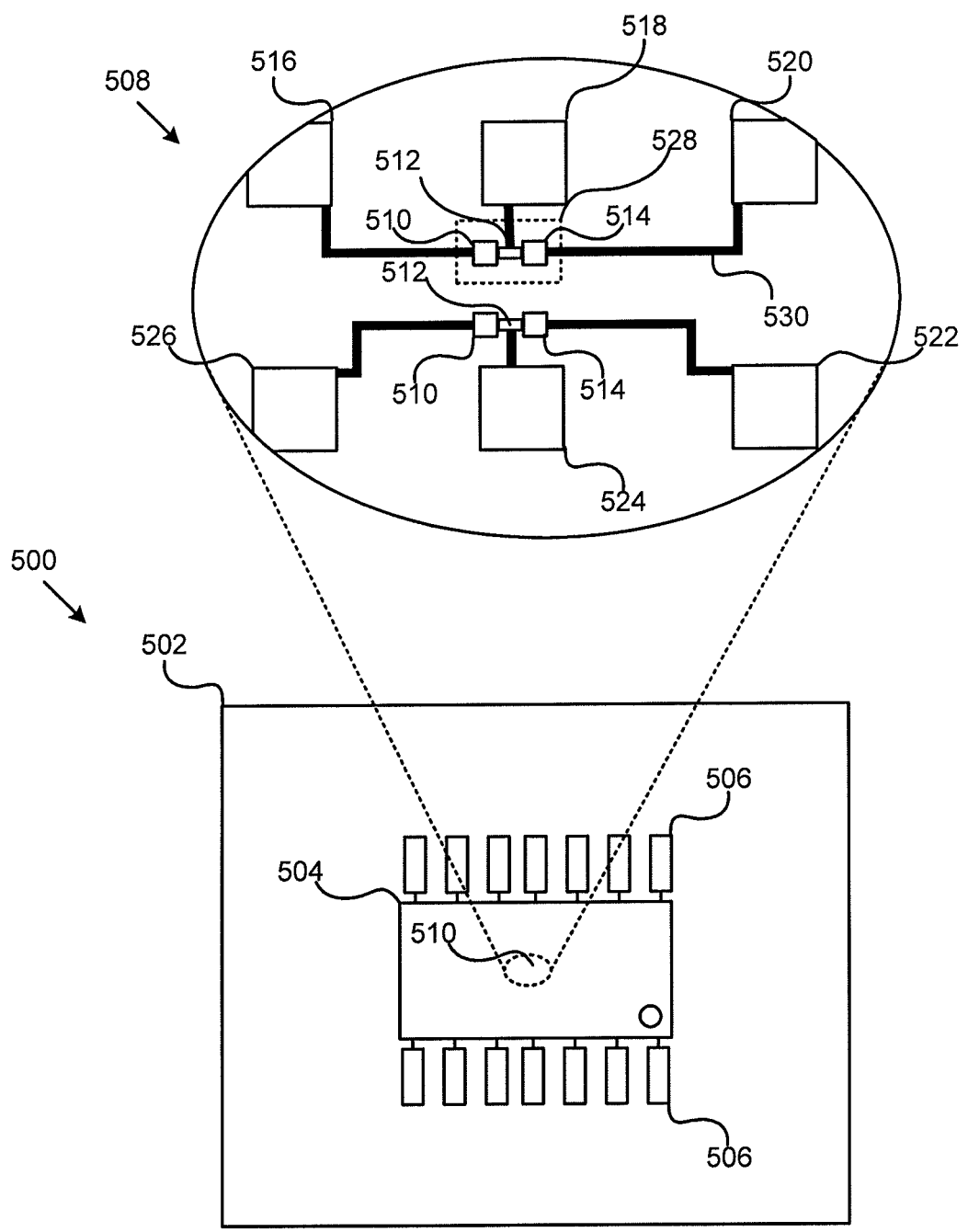
FIG. 5 is a block diagram illustrating implementation of an Integrated Circuit (IC) in a chip package according to one embodiment.

Turning to FIG. 5, a schematic diagram of an Integrated Circuit (IC) device 502 is shown. The chip package 504 houses the transistors that are inside at position 508. The package has interface pins 506 that allow the IC to be electrically coupled to other circuitry. The pins may be made of metal such as nickel. The blowout 508 shows a TFET 528 inside the chip package 504. TFET 528 comprises a source contact 510, a gate contact 512, and a drain contact 514. Each of these electrodes 510, 512, 514 may then be connected through wires or traces 530 with other parts of the integrated circuit 516, 518, 520, 522, 524, and 526. The electrodes 510, 512, 514 may also be connected to a package pin 506.

The schematic flow chart diagram 400 is generally set forth as logical flow chart diagram. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

What is claimed is:

1. A semiconductor device, comprising:
   an insulating layer;
   a first semiconductor layer on the insulating layer;
   a first doped region on the first semiconductor layer;
   a second doped region on the first semiconductor layer, where the second doped region is separated from the first doped region by an air gap;
   a second semiconductor layer on the first doped region, where the second semiconductor layer is coupled to the second doped region;
   a gate stack on the second semiconductor layer, where the gate stack is in complete contact with the second semiconductor layer.

2. The semiconductor device of claim 1, where the gate stack comprises a first dielectric layer and a first metal contact.

3. The semiconductor device of claim 1, where the first doped region is doped with a p-type dopant.

4. The semiconductor device of claim 1, where the second doped region is doped with an n-type dopant.

5. The semiconductor device of claim 1, where the first doped region comprises germanium (Ge).

6. The semiconductor device of claim 1, where the second doped region comprises silicon (Si).

7. The semiconductor device of claim 1, further comprising a third doped region coupled to the first doped region.

8. The semiconductor device of claim 7, where the third doped region comprises Si.

9. The semiconductor device of claim 7, where the third doped region is doped using a p-type dopant.

10. An Integrated Circuit (IC) device, comprising:
    a chip package configured to house an IC;
    a plurality of electrical interface pins coupled to the chip package and in communication with the IC, the electrical interface pins configured to conduct electrical signals; and the IC comprising at least one Tunneling Field-Effect Transistor (TFET) disposed within the chip package, the TFET comprising:
an insulating layer;
a first semiconductor layer on the insulating layer;
a first doped region on the first semiconductor layer;
a second doped region on the first semiconductor layer, where the second doped region is separated from the first doped region by an air gap;
a second semiconductor layer on the first doped region, where the second semiconductor layer is coupled to the second doped region;
a gate stack on the second semiconductor layer, where the gate stack is in complete contact with the second semiconductor layer.

11. The IC device of claim 10, where the first doped region is p-doped Ge.

12. The IC device of claim 10, where the second doped region is n-doped Si.

13. A method for manufacturing a semiconductor device, comprising:
forming an insulating layer;
forming a first semiconductor layer on the insulating layer;
forming a first doped region on the first semiconductor layer;
forming a second semiconductor layer on the first doped region;
forming a gate stack on the second semiconductor layer, where the gate stack is in complete contact with second semiconductor layer;
etching the second semiconductor layer and the first doped region adjacent to the gate stack;
etching the first doped region under the gate stack; and
forming a second doped region on the first semiconductor layer, where the second doped region is separated from the first doped region by an air gap, and wherein the second semiconductor layer is coupled to the second doped region.

14. The method of claim 13, where forming the first doped region on the first semiconductor layer further comprises:
depositing germanium on the first semiconductor layer; and
doping the germanium with a p-type dopant.

15. The method of claim 13, where forming the second semiconductor region layer comprises depositing silicon.

16. The method of claim 13, where etching the second semiconductor layer and the first doped region adjacent to the gate stack comprises:
applying a mask layer over the first doped region; and
performing an anisotropic etch to remove a portion of the second semiconductor layer and a portion of the first doped region.

17. The method of claim 13, where etching the first doped region under the gate stack comprises performing an isotropic etch.

18. The method of claim 13, where forming a second doped region on the first semiconductor layer comprises depositing a semiconductor material, and doping the semiconductor material.

* * * * *